(12) United States Patent
Toth et al.

(10) Patent No.: US 10,551,133 B2
(45) Date of Patent: Feb. 4, 2020

(54) REINFORCED HEAT-TRANSFER DEVICE, HEAT-TRANSFER SYSTEM, AND METHOD OF REINFORCING A HEAT-TRANSFER DEVICE

(71) Applicant: Thermal Corp., Wilmington, DE (US)

(72) Inventors: Jerome E. Toth, Exton, PA (US); Leonard N. Dore, Lancaster, PA (US); Doug Grove, Lancaster, PA (US); Austin Cornell, Lancaster, PA (US)

(73) Assignee: Thermal Corp., Wilmington, DE (US)

( * ) Notice: Subject to any disclaimer, the term of this patent is extended or adjusted under 35 U.S.C. 154(b) by 740 days.

(21) Appl. No.: 14/031,685

(22) Filed: Sep. 19, 2013

(65) Prior Publication Data

US 2014/0076517 A1 Mar. 20, 2014

Related U.S. Application Data

(60) Provisional application No. 61/703,534, filed on Sep. 20, 2012.

(51) Int. Cl.
*F28F 9/007* (2006.01)
*F28D 15/02* (2006.01)
*H05K 7/20* (2006.01)

(52) U.S. Cl.
CPC .......... *F28F 9/007* (2013.01); *F28D 15/0266* (2013.01); *F28D 15/0275* (2013.01); *H05K 7/20936* (2013.01); *F28F 2225/00* (2013.01)

(58) Field of Classification Search
CPC .. F28D 15/0266; F28D 15/0275; F28F 9/007; F28F 2225/00; H05K 7/20936
See application file for complete search history.

(56) References Cited

U.S. PATENT DOCUMENTS

| | | |
|---|---|---|
| 5,253,702 A | 10/1993 | Davidson et al. |
| 5,329,993 A | 7/1994 | Ettehadieh |
| 6,062,299 A | 5/2000 | Choo et al. |
| 6,230,788 B1 | 5/2001 | Choo et al. |
| 6,385,044 B1 | 5/2002 | Colbert et al. |
| 6,459,582 B1 | 10/2002 | Ali et al. |
| 6,639,800 B1 | 10/2003 | Eyman et al. |
| 6,681,843 B2 | 1/2004 | Sugito |
| 6,765,793 B2 | 6/2004 | Kehret et al. |
| 6,883,594 B2 | 4/2005 | Sarraf et al. |

(Continued)

FOREIGN PATENT DOCUMENTS

| | | |
|---|---|---|
| JP | 8053100 | 2/1996 |
| JP | 2007198661 | 8/2007 |

*Primary Examiner* — Jon T. Schermerhorn, Jr.

(74) *Attorney, Agent, or Firm* — Michael Best & Friedrich LLP

(57) ABSTRACT

A heat-transfer device and system for conducting heat from a heat source. The heat-transfer device can include an evaporator having one or more reinforcement elements occupying respective recesses defined in a body of the evaporator, wherein the reinforcement elements are more resistant to deformation under clamp load than the material of the evaporator body, while still having desirable heat conductivity. In some embodiments, the heat-transfer system includes a plurality of serially coupled evaporators for generating a respective vapor; at least one reinforcement element interposed between adjacent evaporators; and a condenser in fluid communication with the evaporator.

32 Claims, 5 Drawing Sheets

(56) References Cited

U.S. PATENT DOCUMENTS

| | | | |
|---|---|---|---|
| 6,944,022 B1 | 9/2005 | Kehret et al. | |
| 7,327,572 B2 | 2/2008 | Erturk et al. | |
| 7,353,860 B2 | 4/2008 | Erturk et al. | |
| 7,639,503 B2 | 12/2009 | Tanaka | |
| 7,791,884 B2 * | 9/2010 | Huang | H05K 7/20936 |
| | | | 165/104.21 |
| 8,018,719 B2 | 9/2011 | Busch | |
| 2005/0133198 A1 | 6/2005 | Armstrong et al. | |
| 2006/0065385 A1 | 3/2006 | Tonosaki et al. | |
| 2007/0012429 A1 * | 1/2007 | Siu | F28D 15/0233 |
| | | | 165/104.33 |
| 2007/0068657 A1 | 3/2007 | Yamamoto et al. | |
| 2008/0210407 A1 | 9/2008 | Kim et al. | |
| 2010/0243212 A1 | 9/2010 | Meyer, IV et al. | |
| 2011/0108237 A1 | 5/2011 | Kamath et al. | |
| 2011/0176276 A1 * | 7/2011 | Sarraf | F28D 15/02 |
| | | | 361/705 |

* cited by examiner

ABSTRACT

REINFORCED HEAT-TRANSFER DEVICE, HEAT-TRANSFER SYSTEM, AND METHOD OF REINFORCING A HEAT-TRANSFER DEVICE

CROSS-REFERENCE TO RELATED APPLICATIONS

This application claims priority to U.S. Provisional Patent Application No. 61/703,534 filed Sep. 20, 2012, the content of which is incorporated herein by reference in its entirety.

BACKGROUND

A heat pipe can conduct heat from a heat source such as from an electronic device through vapor heat transfer. Typically, the heat pipe includes a working fluid, an evaporator section, and a condenser section. The working fluid is vaporized at the evaporator section. The vapor is received at the condenser section, whereupon the vapor is condensed to form a liquid working fluid. Capillary action and/or gravity returns the condensed working fluid to the evaporator section, thereby completing a cycle.

In many applications, heat pipes of various shapes and sizes are clamped to other elements (e.g., a device or structure generating heat to be removed by the heat pipes) in order to increase the efficiency of heat transfer to and/or from the heat pipes. For example, a plurality of heat pipes can be used in a switching unit for a motor drive. Motor drives are power conversion systems that provide power to electric motors in a controlled fashion. In a switching unit for a motor drive, semiconductor switching devices can be positioned between heat pipes, abutting the evaporator sections of the heat pipes. The assembly of switching devices and heat pipes is clamped together to maintain good electrical and thermal conduction therebetween. Other examples of heat pipe clamping applications and clamping devices exist.

Despite the advantages of clamping heat pipes to other structures as described above, in many cases the preferred clamping forces can damage some heat pipes, such as heat pipes comprising material, dimensions, and/or shapes that make the heat pipes less resistant to deformation under high clamping loads. With reference to switching units as described above, clamping forces can be as high as 20 kN.

As an example of a heat pipe feature that renders the heat pipe less able to withstand desired clamping forces without immediate deformation or deformation (i.e., "creep") over a period of time, some heat pipes are made of annealed copper, which can be relatively soft. The copper can be annealed for a variety of reasons, such as by being exposed to high temperatures needed to sinter wick material on inside surfaces of the heat pipe. In any case, high desired clamping forces may distort and potentially damage such heat pipes. A distorted heat pipe may degrade heat transfer from the semiconductor devices, and may even damage the devices.

Thus, there has developed a need for a heat transfer device more capable of resisting clamp loads exerted on one or more surfaces of the device, as well as heat transfer and heat clamping systems in which such heat transfer devices are used.

SUMMARY

In some embodiments, a heat-transfer system is provided for conducting heat from a heat source, and includes a plurality of serially coupled evaporators for generating a respective vapor, at least one reinforcement element interposed between adjacent evaporators, and a condenser in fluid communication with the evaporator.

In other embodiments, an evaporator is provided for generating a vapor, and includes an enclosed vapor chamber having a wall, the wall defining a recess; and a reinforcement element located at least partially within the recess.

Some embodiments of the present invention provide a heat transfer system, the heat transfer system including a plurality of serially coupled evaporators for generating a respective vapor, at least one of the evaporators including an enclosed vapor chamber having a wall; a reinforcement element adjacent to the wall, the reinforcement element including an outer surface; a condenser in fluid communication with the evaporator; and a clamp for compressing the evaporators together, the clamp including two end plates and a coupling member extending between the end plates.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising" or "having" and variations thereof herein is meant to encompass the items listed thereafter and equivalents thereof as well as additional items. The terms "mounted," "connected" and "coupled" are used broadly and encompass both direct and indirect mounting, connecting and coupling. Further, "connected" and "coupled" are not restricted to physical or mechanical connections or couplings, and can include electrical connections or couplings, whether direct or indirect.

Figure 1:
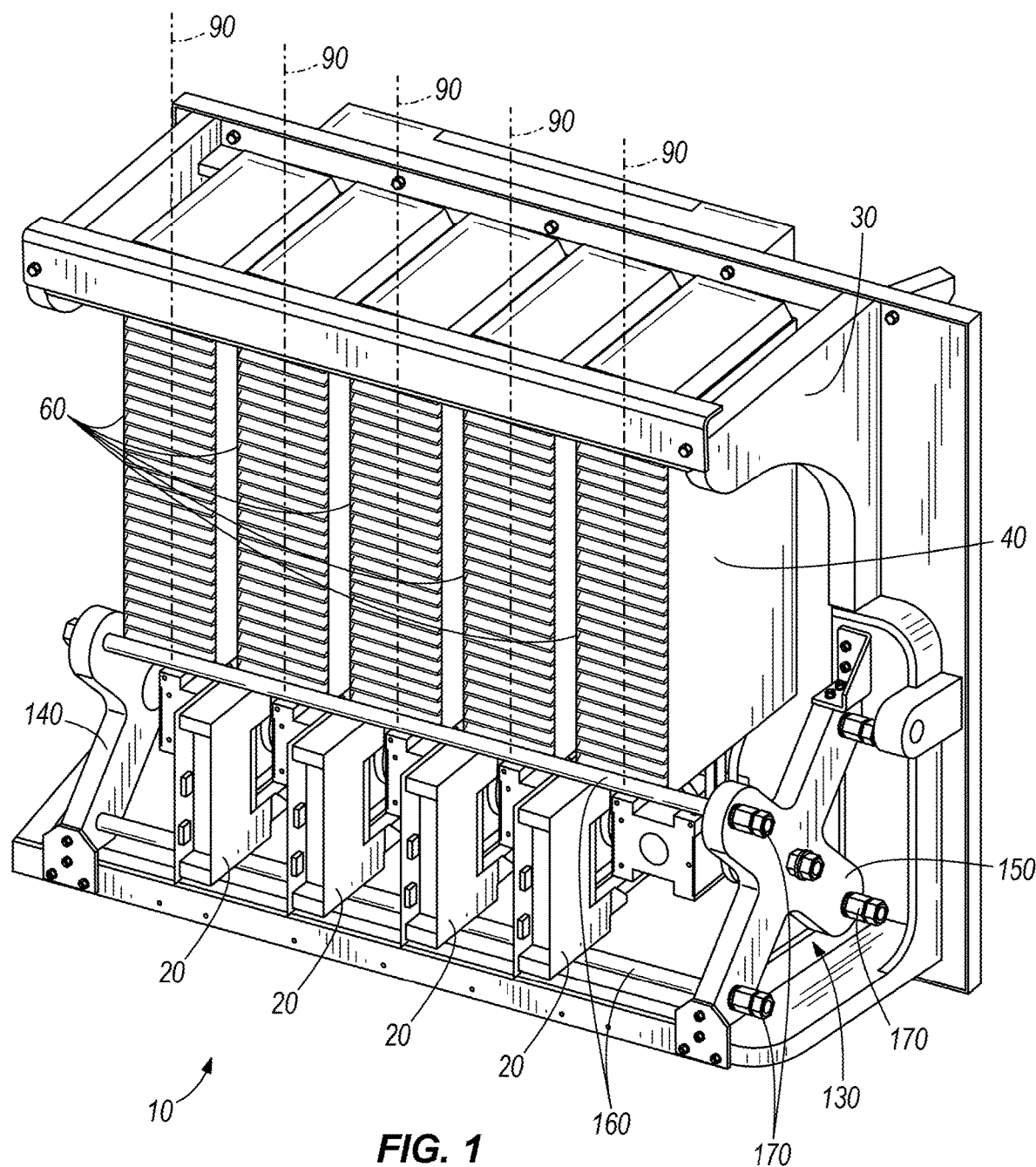
FIG. 1 is a perspective view of a heat-transfer system according to some embodiments of the invention, illustrating a plurality of serially coupled heat-transfer devices.
Figure 2:
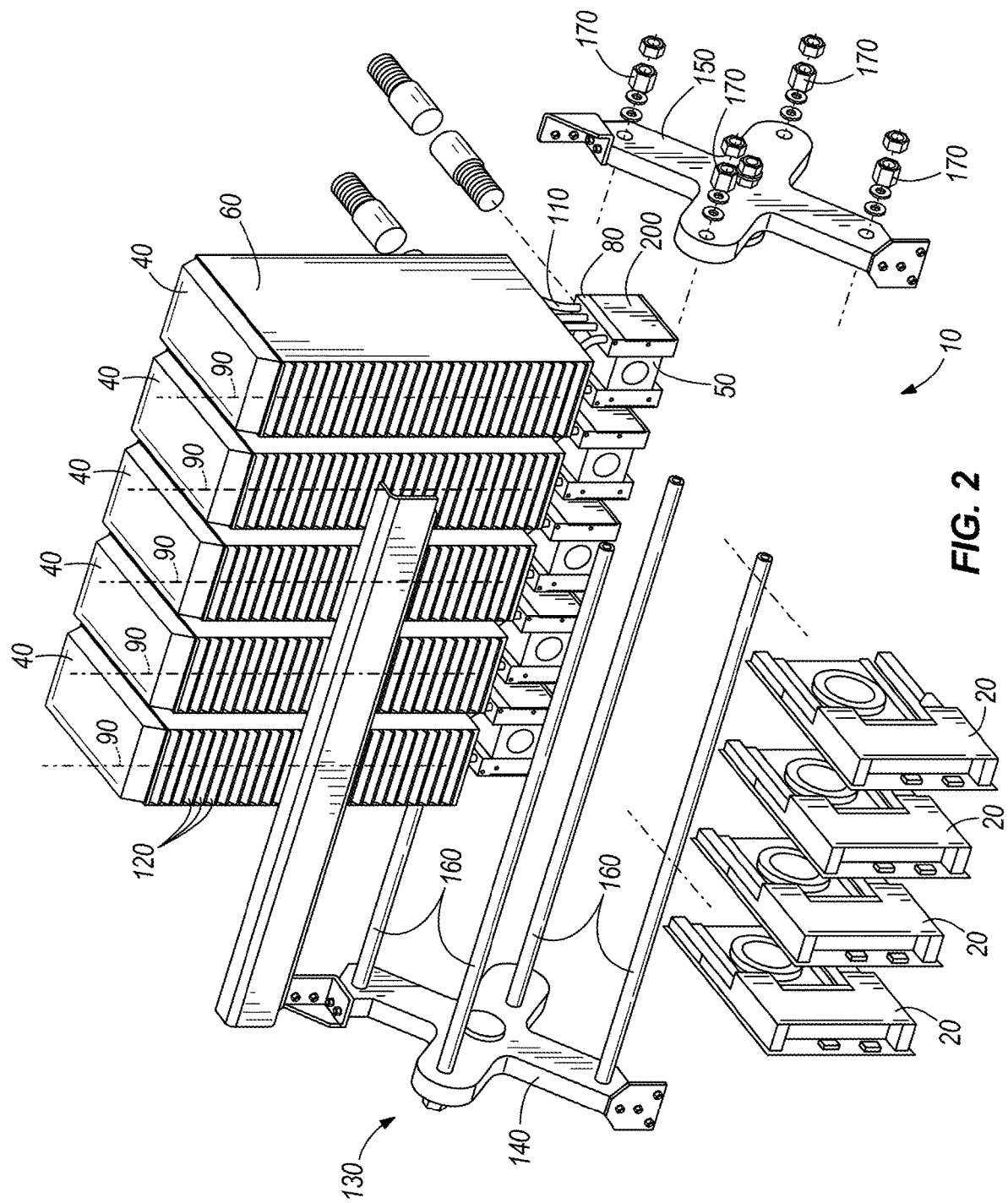
FIG. 2 is an exploded perspective view of the heat-transfer system of FIG. 1.

FIG. 1 is a perspective view of a heat-transfer system 10 for conducting heat from heat sources 20. Referring also to FIG. 2, the heat-transfer system 10 generally includes a power cage or frame 30 and a plurality of serially coupled heat-transfer devices 40 contained or housed therein. Although in the illustrated embodiment the heat-transfer system 10 includes give heat-transfer devices 40 clamped to four heat sources 20, in further embodiments, the heat-transfer system 10 may include one or more heat-transfer devices 40 clamped to one or more heat sources 20. Accordingly, a single heat-transfer device 40 clamped to a single heat source 20, a single heat-transfer device 40 clamped between two heat sources 20, or a single heat source 20 clamped between two heat-transfer devices 40 are possible and fall within the spirit and scope of the invention. In the illustrated embodiment, a plurality of heat-transfer devices 40 extends within the power cage 30 adjacent and offset from one another in series. In other embodiments, however, one or more of the heat-transfer devices 40 may be fused to one another. The power cage 30 can be made of an electrically non-conductive material such as epoxy resin.

Each heat-transfer device 40 includes a working fluid (not shown), an evaporator 50 for generating a vapor from the working fluid, and a condenser 60 in fluid communication with the evaporator 50. In the illustrated embodiment, and with reference to FIGS. 3 and 4, each evaporator 50 includes an enclosed vapor chamber (not shown) comprising a body 55 having a pair of walls 80 that are substantially parallel to each other. The condenser 60 of the illustrated embodiment is a generally rectangular box that measures longer in a longitudinal direction generally extending between the evaporator 50 and a top surface of the power cage 30, and shorter in a direction that is perpendicular to the longitudinal direction. As used herein, the terms "top," "bottom," "front," "rear," "side," and other directional terms are not intended to require any particular orientation, but are instead used for purposes of description only. Each heat-transfer device 40 defines a respective longitudinal axis 90.

The working fluid resides within the vapor chamber. Any number of fluids can be suitable as a working fluid so long as they have a liquid phase and a vapor phase. Suitable working fluids include, but are not limited to, water, ammonia, Freon® (E. I. du Pont de Nemours and Company), acetone, ethane, ethanol, heptane, methanol, potassium, sodium, hydrocarbons, fluorocarbons, methyl chloride, liquid metals such as cesium, lead, lithium, mercury, rubidium, and silver, cryogenic fluids such as helium and nitrogen, and other fabricated working fluids. The particular working fluid can be chosen depending on the operating temperature requirements or other preferences for the particular heat-transfer system 10.

With continued reference to FIGS. 1 and 2, the heat sources 20 of the illustrated embodiment are disposed between adjacent evaporators 50. In some embodiments, the heat sources 20 include electronic devices or switching devices. The body 55 of the evaporator 50 is typically made of metal, e.g., annealed copper, brass, aluminum, stainless steel, and the like, to provide good electrical and thermal conduction to abutting electronic devices 20. In operation, the working fluid is vaporized at the evaporator 50 to absorb heat from an abutting electronic device 20. The vapor flows from the evaporator 50 and is received at the condenser 60 through one or more inlet pipes. In the illustrated embodiment, each heat-transfer device 40 includes at least two pipes 110, one of which can be an inlet pipe and the other an outlet pipe. The illustrated condenser 60 includes a plurality of substantially parallel spaced-apart cooling fins 120. Also with reference to the illustrated embodiment, the fins 120 are oriented substantially perpendicular to the longitudinal axis 90. In other embodiments, however, the fins 120 may be oriented at other angles relative to the longitudinal axis 90. The condenser 60 cools the working fluid with air that flows or passes through the fins 120. The heat of the working fluid is thus removed to the atmosphere, and the vapor is condensed to form a liquid working fluid. The working fluid is returned through one or more outlet pipes 110, and supplied to the evaporator 50, thereby completing a cycle.

A clamp 130 is provided for compressing the evaporators 50 and switching devices 20 together so as to maintain a good electrical and thermal conduction therebetween. The clamp 130 includes two end plates 140, 150 and one or more coupling members 160 extending between the end plates 140, 150. In the illustrated embodiment, each end plate 140, 150 is generally X-shaped. In other embodiments, however, the end plates 140, 150 are not necessarily generally X-shaped. For example, the shape of one or both of the end plates 140, 150 may be a polygon, a circle, an oval, an ellipse, or a combination thereof. In the illustrated embodiment, four coupling members 160 extend between the end plates 140, 150. Each coupling member 160 includes on one end a respective fastener 170 that is threaded to secure the end plate 150 thereto. In other embodiments, one or more of the coupling members 160 may include fasteners 170 on both ends to the secure the end plates 140, 150 thereto. In still other embodiments, one or more of the coupling members 160 may be secured to the end plates 140, 150 using other suitable mechanisms that provide a compressive force. Although in the illustrated embodiment a surface of the evaporator 50 is clamped to a heat source 20 for a particular application, the invention finds application in any other case in which clamping force is used between an evaporator 50 and a heat source 20. Moreover, the use of any other clamping device or structure suitable for clamping one or more heat sources 20 to the evaporator 50 of one or more heat-transfer device 40 is contemplated herein and falls within the spirit and scope of the present invention.

The heat-transfer devices 40 optionally include a wick (not shown) disposed on at least a portion of the interior surfaces of the pipes 110. In some embodiments, the evaporator 50 is at least partially hollow, and a wick is disposed on inside surfaces of the evaporator 50. In embodiments that do not include the wick, the working fluid may be returned through the outlet pipe 110 via gravity. The wick may be formed by any materials so as to suitably provide a capillary action that returns the condensed working fluid to the evaporator 50. Suitable wick materials include, but are not limited to, a sintered or brazed metal structure, screen metal mesh, and longitudinal or spiral grooves. Sintering or brazing requires heating the heat-transfer device 40 with the wick structure to above 450° C.-1000° C. Such heat treatment can anneal the material (e.g., copper) from which the heat-transfer device 40 is formed, thereby substantially softening the material. As described above, a softened heat-transfer device 40 may undesirably distort and potentially become damaged under a high clamping force, either instantly or over some time.

Figure 3:
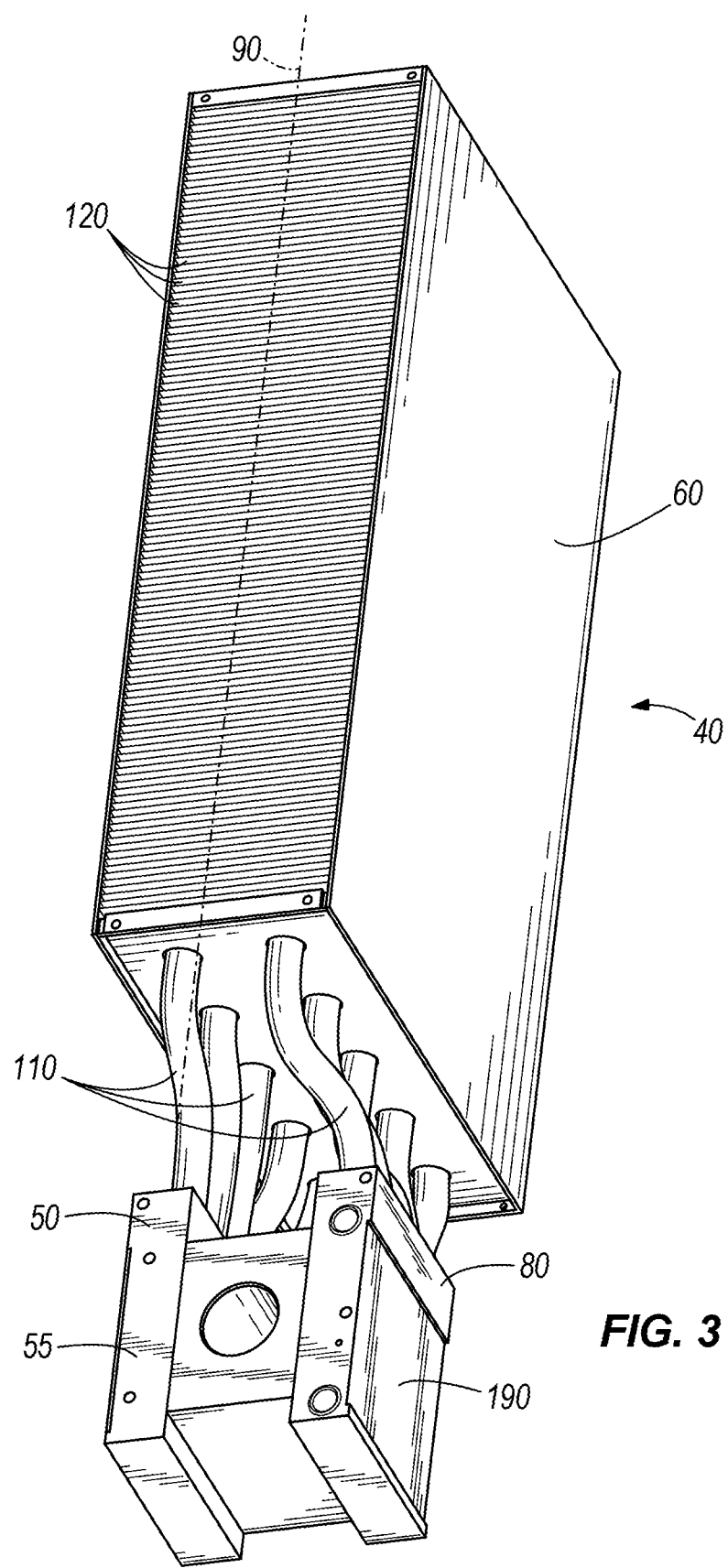
FIG. 3 is a perspective view of the heat-transfer device of FIG. 1, illustrating a condenser in fluid communication with an evaporator.
Figure 4:
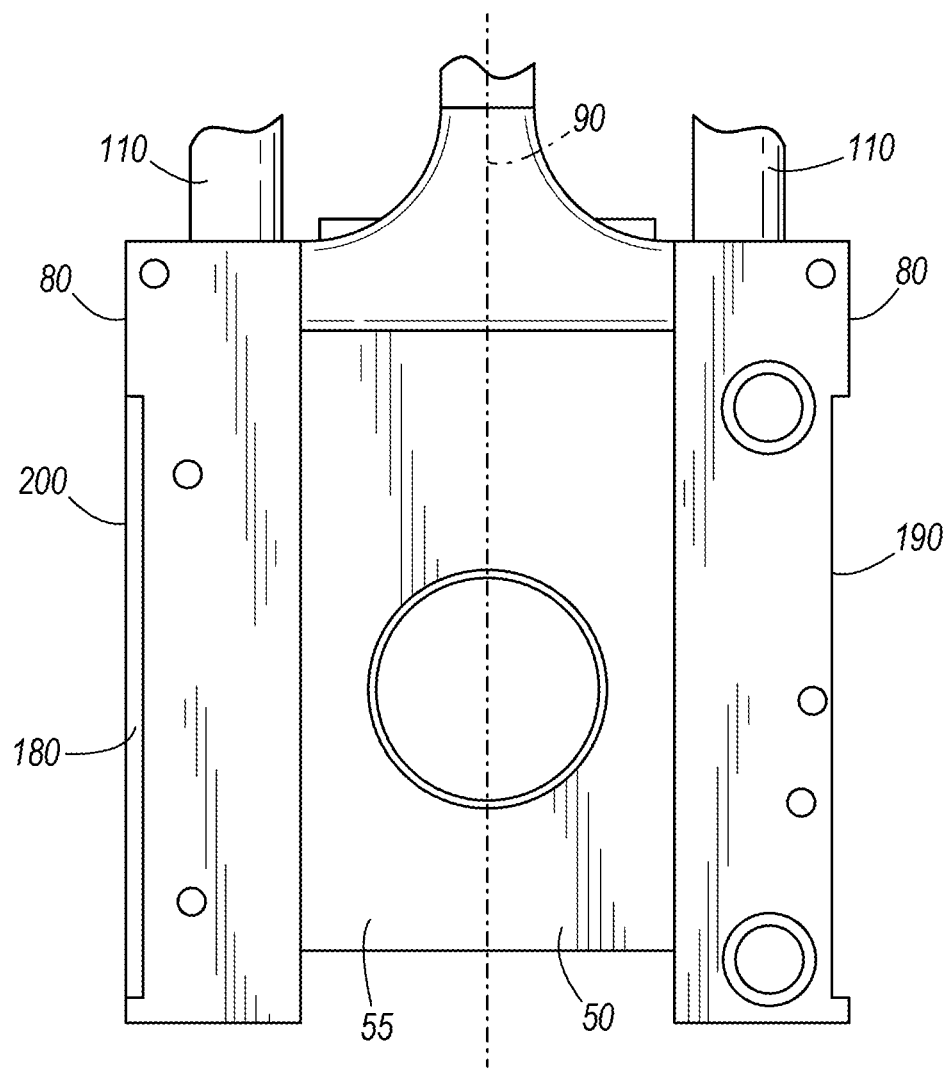
FIG. 4 is a side view of the evaporator of FIG. 3.
Figure 5:
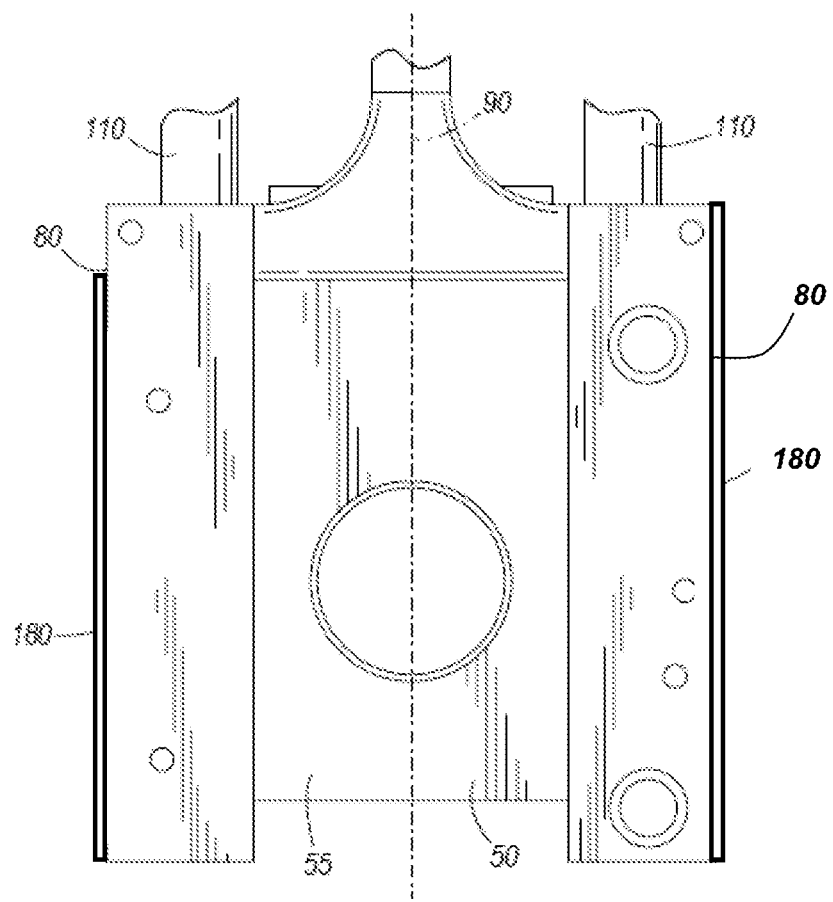
FIG. 5 is a side view of another embodiment of an evaporator.

Referring to FIGS. 3 and 4, the evaporator 50 includes a reinforcement element 180 (see FIG. 4) within a recess 190 of the wall 80 to withstand a high clamping force. In some embodiments, the wall 80 that receives the reinforcement element 180 does not include a recess (FIG. 5) or may have only a partial recess 190, and the reinforcement element 180 may be larger than, smaller than (FIG. 5, left), or the same area (FIG. 5, right) as the face of the wall 80 to which the element 180 is attached. All or parts of the recess 190 may be cast or molded into the evaporator wall 80, machined after the evaporator 50 has been made, or formed in any other suitable manner. In some embodiments, the reinforcement element 180 is a sheet or faceplate, although other structures performing the same function as the reinforcement element 180 disclosed herein can be used instead. In some embodiments, the reinforcement element 180 includes copper which, unlike the body of the evaporator 50, has not been annealed. In other embodiments, the reinforcement element 180 includes the same material as the body 55 of the evaporator 50, but that has not been annealed, or includes another material having a stiffness, hardness, or resistance to deformation that is greater than that of the body of the evaporator 50. In some embodiments, the reinforcement element 180 is soldered to the recess 190. Soldering generally refers to a process in which two or more metal items are joined together by a heated and melted solder alloy. The solder alloy melts while the metals to which the solder will be joined are heated, and wets and flows over the surface of the to-be-joined metals. Typical solder alloys include, but are not limited to, tin-lead alloys, tin-antimony alloys, tin-silver alloys, tin-zinc alloys, cadmium-silver alloys, cadmium-zinc alloys, zinc-aluminum alloys, indium-base alloys, bismuth-base alloys, and gold-base alloys. Soldering can be generally limited to a low temperature range, such as no more than about 450° C. As such, the heating of the solder alloy would not necessarily anneal the reinforcement element 180 and thus would not change the hardness. In other embodiments, the reinforcement element 180 may be coupled to the recess 190 by other suitable mechanisms, e.g., via welding, brazing, or adhesives (e.g. glue or other suitable adhesives), depending on considerations such as temperature, cost, and ease of use.

In particular embodiments, the reinforcement element 180 is made from metals such as copper, brass, aluminum, stainless steel, and the like, or alloys thereof such as MONEL® (nickel-copper alloy), copper-molybdenum alloys, clad materials such as copper/moly, molybdenum, KOVAR®, INVAR®, K-CORE®, tungsten, stainless steel, dispersion strength copper such as GLIDCOP® (copper alloy containing aluminum oxide ceramic particles), dispersion-hardened (or -strengthened) copper, or other solderable metals or alloys.

In some embodiments the heat sources 20 may be adhered to the reinforcement element 180, e.g. using welding, brazing, or adhesives, or the heat source 20 may be very tightly compressed against the reinforcement element 180. In these and other embodiments, it may be advantageous to use a material for the reinforcement element 180 which has a coefficient of thermal expansion (CTE) that is suitably matched to the properties of the heat source 20 (which may include electronic components which include silicon) and the evaporator 50 (which may be copper or another thermally conductive metal) to minimize stress between the adjacent parts that would otherwise result from heating and cooling cycles. In these embodiments, the reinforcement element 180 may suitably be made of a CTE-matched material such as KOVAR®, INVAR®, K-CORE®, or various clad materials. Use and selection of CTE-matched materials is known to those skilled in the art and is disclosed in US Patent Application Publication US 2011/0176276, which is incorporated herein by reference in its entirety.

In various embodiments, the reinforcement element 180 is a plate having a thickness of about 0.5 mm, about 1.0 mm, about 2.0 mm, about 3.0 mm, about 4.0 mm, about 5.0 mm, about 10 mm, about 13 mm, about 20 mm, about 30 mm, about 40 mm, about 50 mm, about 75 mm, or about 100 mm thick. In certain embodiments, the reinforcement element 180 covers about 10%, about 20%, about 30%, about 40%, about 50%, about 60%, about 70%, about 80%, about 90%, about 95%, about 99%, or about 100% of the wall 80 of the evaporator 50. The thermal conductivity k of the reinforcement element 180, as well as the material(s) used to secure the reinforcement element 180 to the evaporator 50, may range from about 10 to about 500 W/(m·K) (e.g. copper has a thermal conductivity of about 400 W/(m·K)). The Mohs hardness of the reinforcement element 180 may be about 1.0, about 2.0, about 3.0, about 4.0, about 5.0, about 6.0, about 7.0, about 8.0, or about 9.0. Using a material with greater hardness has an advantage of making the reinforcement element 180 more resistant to marring, denting, and scratching.

In some embodiments the wall 80 of the evaporator 50 is relatively soft, which in some embodiments may be equivalent to H00 Cold-Rolled ⅛ Hard or 060 Soft (Table 1), while the reinforcement element 180 is harder, which in some embodiments may be H02 Half Hard or harder (Table 1). Other levels of hardness for the wall 80 and the reinforcement element 180 are also possible, provided that the reinforcement element 180 has a greater hardness than the wall 80.

TABLE 1

Mechanical Properties of Copper

| Temper Designation Standard | Tensile Strength (Ksi) | | Yield Strength (Ksi) Min. |
|---|---|---|---|
| | Min. | Max. | |
| 060 Soft | 30 | 38 | — |
| H00 Cold-Rolled ⅛ Hard | 32 | 40 | 20 |
| H01 Cold-Rolled high yield ¼ Hard | 34 | 42 | 28 |
| H02 Half Hard | 37 | 46 | 30 |
| H03 Three quarter Hard | 41 | 50 | 32 |
| H04 Hard | 43 | 52 | 35 |

In various embodiments, the reinforcement element 180 has a material yield strength of at least 50 MPa, at least 70 MPa, at least 100 MPa, at least 150 MPa, at least 200 MPa, at least 250 MPa, at least 300 MPa, at least 400 MPa, at least 500 MPa, or at least 1000 MPa. In general, the reinforcement element 180 is selected so that it has a material yield strength that is greater than the material yield strength of the evaporator 50.

In the illustrated embodiment, the wall 80 has a first stiffness, which may be determined, e.g., using a suitable ASTM test specimen, and has a first Vickers hardness number associated therewith. The reinforcement element 180 has a second stiffness, which may also be determined, e.g. using a suitable ASTM test specimen, and has a second Vickers hardness number associated therewith. In some embodiments, the second stiffness is higher than the first stiffness. In some embodiments, the second Vickers hardness number is higher than the first Vickers hardness number. Further, in various embodiments the hardness and stiffness of the wall 80 and the reinforcement element 180 may be determined and expressed using other measures such as the Brinell hardness scale.

In the illustrated embodiment (FIG. 4), the reinforcement element 180 includes an outer surface 200 that is substantially flush with adjacent portions of the wall 80 when the reinforcement element 180 is positioned in the recess 190, resulting in an evaporator having the same overall dimensions without the recess 190, but with significantly increased resistance to deformation due to the presence of the reinforcement element 180. The flush arrangement of the reinforcement element 180 enables clamping loads to be applied without interference with adjacent portions of the wall 80. However, in other embodiments, the outer surface 200 of the reinforcement element 180 may be slightly raised, or slightly recessed, relative to adjacent portions of the wall 80. In use, a reinforcement element 180 may be coupled to each wall 80 of the evaporator 50. As such, a pair of reinforcement elements 180 is positioned at interfaces where the electronic device 20 and the evaporators 50 engage each other. In other embodiments, at least one reinforcement element 180 is interposed between adjacent evaporators 50.

In manufacturing the heat-transfer system 10, one or more evaporator bodies 55 are formed of metal, with a recess 190 machined or otherwise suitably formed on the wall 80. The evaporator body 55 may be at least partially hollow, and a wick material may be disposed on inside surfaces of the evaporator body 55. The wick material may be sintered or brazed by heating the evaporator body 50 with the wick structure to above 450° C.-1000° C. The evaporator body 55 is then charged with a working fluid. Separately formed cooling fins 120 are connected to the evaporator body 55 through one or more pipes 110. The reinforcement element 180 is formed of a material having a stiffness, hardness, or resistance to deformation greater than that of the evaporator body 55. The reinforcement element 180 may be soldered to the recess 190, or otherwise suitably coupled to the recess 190, e.g., via welding or adhesives.

An illustrative embodiment of the evaporator 50 is described in greater detail below.

EXAMPLE

The evaporator 50 can be a generally H-shaped block comprising a pair of walls 80 that are substantially parallel to each other and extending along the longitudinal axis 90. Each wall 80 in this particular example can include a respective recess 190 that measures 8.4 cm in the longitudinal direction and 2 mm in depth substantially perpendicular to the longitudinal direction. The evaporator 50 can be positioned on the power cage 30 or other support structure. Each recess 190 can be configured to start at a position spaced 3 mm from the support structure 30, extending upwardly and away from the support structure. Reinforcement elements 180 can be soldered to each recess 190. The wall 80 in this particular example is completely annealed (e.g. 060 Soft, Table 1) whereas the reinforcement element 180 in this particular example is H02 Half Hard (Table 1). Thus, the reinforcement element 180 has a hardness that is higher than that of the wall 80.

Although the invention has been described in detail with reference to certain preferred embodiments, variations and modifications exist within the scope and spirit of one or more independent aspects of the invention as described.

What is claimed is:

1. A heat-transfer system for conducting heat from a heat source, the heat-transfer system comprising:
   a plurality of serially coupled evaporators for generating a respective vapor;
   a plurality of reinforcement elements interposed between adjacent evaporators; and
   a condenser in fluid communication with at least one of the evaporators;
   wherein at least one of the evaporators includes an enclosed vapor chamber defined at least in part by a first wall and a second, oppositely spaced wall, wherein the first wall includes a blind recessed portion that opens to an environment exterior of the evaporator, wherein a first one of the reinforcement elements is coupled to an exterior surface of the first wall and is disposed at least partially within the blind recessed portion, and wherein a second one of the reinforcement elements is coupled to an exterior surface of the second wall.

2. The heat-transfer system of claim 1, wherein the blind recessed portion is a first blind recessed portion, wherein the second wall includes a second blind recessed portion along the exterior surface of the second wall, and wherein the second reinforcement element is disposed at least partially within the second blind recessed portion.

3. The heat transfer device of claim 2, wherein the at least one evaporator has a length and at least one of the first recessed portion and the second recessed portion extends along the entire length of the at least one evaporator.

4. The heat-transfer system of claim 1, wherein the first reinforcement element includes an exterior surface that is substantially flush with a portion of the exterior surface of the first wall when the first reinforcement element is at least partially disposed within the blind recessed portion.

5. The heat-transfer system of claim 1, wherein the first wall has a first material yield strength, the first reinforcement element has a second material yield strength, and the second material yield strength is higher than the first material yield strength.

6. The heat-transfer system of claim 1, wherein the first reinforcement element comprises a first material and the first wall comprises a second material different from the first material, and wherein the first material has a greater hardness than the second material.

7. The heat-transfer system of claim 1, wherein the first reinforcement element is glued, soldered, or brazed to the blind recessed portion.

8. The heat-transfer system of claim 1, wherein the first reinforcement element includes copper.

9. The heat-transfer system of claim 1, further comprising a clamp for compressing the evaporators together, the clamp including two end plates and a coupling member extending between the end plates.

10. The heat-transfer system of claim 1, wherein the first wall is annealed, and wherein the first reinforcement element is not annealed.

11. The heat-transfer system of claim 1, wherein the first wall is a monolithic wall.

12. The heat-transfer system of claim 1, wherein the first one of the reinforcement elements is a monolithic reinforcement element having a surface exposed to the environment exterior of the evaporator.

13. An evaporator for generating a vapor, the evaporator comprising:
    a first wall;
    a second wall spaced from the first wall;
    an enclosed vapor chamber disposed between the first and the second walls;
    a first monolithic reinforcement element having a first surface coupled to an exterior surface of the first wall, and a second, opposite surface exposed to an environment exterior of the evaporator; and
    a second reinforcement element having an exterior surface coupled to an exterior surface of the second wall,
    wherein the first wall is located between the first reinforcement element and the vapor chamber at all points along the first reinforcement element.

14. The evaporator of claim 13, wherein the first reinforcement element includes an exterior surface that is substantially flush with adjacent portions of the first wall.

15. The evaporator of claim 13, wherein the first wall has a first material yield strength, the first reinforcement element has a second material yield strength, and the second material yield strength is higher than the first material yield strength.

16. The evaporator of claim 13, wherein the first reinforcement element comprises a first material and the first wall comprises a second material different from the first material, and wherein the first material has a greater hardness than the second material.

17. The evaporator of claim 13, wherein the first reinforcement element is soldered to the first wall.

18. The evaporator of claim 13, wherein the first reinforcement element includes copper.

19. The evaporator of claim 13, wherein the first and second walls are substantially parallel to each other.

20. The evaporator of claim 13, wherein the first wall is annealed, and wherein the first reinforcement element is not annealed.

21. The heat-transfer system of claim 13, wherein the first wall is a monolithic wall.

22. A heat-transfer system comprising:
a plurality of serially coupled evaporators for generating a respective vapor, the serially coupled evaporators spaced apart from one another along a first direction, at least one of the evaporators including an enclosed vapor chamber defined at least in part by a wall having an exterior surface and a recessed portion, the exterior surface and the recessed portion together formed from one piece of material;
a reinforcement element coupled to the wall in the recessed portion the reinforcement element including an outer surface that extends along a second direction that is different from the first direction and contacts an electronic device, the electronic device disposed adjacent the at least one of the evaporators along the first direction;
a condenser in fluid communication with the at least one of the evaporators, the condenser spaced from the at least one of the evaporators along the second direction; and
a clamp for compressing the evaporators together along the first direction, the clamp including two end plates and a coupling member extending between the end plates.

23. The heat-transfer system of claim 22, wherein the wall has a first material yield strength, the reinforcement element has a second material yield strength, and the second material yield strength is higher than the first material yield strength.

24. The heat-transfer system of claim 22, wherein the reinforcement element comprises a first material and the wall comprises a second material different from the first material, and wherein the first material has a greater hardness than the second material.

25. The heat-transfer system of claim 22, wherein the reinforcement element is disposed between the electronic device and the at least one of the evaporators, and wherein the reinforcement element comprises a first layer adjacent to the electronic device which has a coefficient of thermal expansion that is substantially similar to that of the electronic device, and a second layer adjacent to the at least one of the evaporators which has a coefficient of thermal expansion that is substantially similar to the at least one of the evaporators.

26. The heat-transfer system of claim 22, wherein the wall is annealed, and wherein the reinforcement element is not annealed.

27. The heat-transfer system of claim 22, wherein the wall is a first wall, the exterior surface is a first exterior surface, the recessed portion is a first recessed portion, and the reinforcement element is a first reinforcement element, wherein the at least one of the evaporators includes a second wall spaced from the first wall, wherein the second wall includes a second exterior surface and a second recessed portion, the second exterior surface and the second recessed portion together formed from one piece of material, and wherein a second reinforcement element is coupled to the second wall in the second recessed portion.

28. The heat transfer device of claim 22, wherein the at least one evaporator has a length and the recessed portion extends along the entire length of the at least one evaporator.

29. The heat-transfer system of claim 22, wherein the recessed portion is at least partially defined by a second exterior surface offset from the first exterior surface and a first transition surface extending between the first and second exterior surfaces, wherein the first exterior surface, the second exterior surface, and the transition surface are each surfaces of the same piece of material.

30. The heat-transfer system of claim 29, wherein the second exterior surface and the transition surface are machined surfaces.

31. A heat-transfer system comprising:
a plurality of serially coupled evaporators for generating a respective vapor, the serially coupled evaporators spaced apart from one another along a first direction, at least one of the evaporators including an enclosed vapor chamber defined at least in part by a first wall and a second, oppositely spaced wall;
a plurality of monolithic reinforcement elements interposed between adjacent evaporators, wherein a first one of the monolithic reinforcement elements is coupled to the first wall in a blind recessed portion of the first wall, the blind recessed portion of the first wall and an exterior surface of the first wall being formed from one piece of material, wherein the first wall is disposed between the vapor chamber and the first reinforcement element at all points along the first reinforcement element, wherein a second one of the monolithic reinforcement elements is coupled to the second wall, wherein the first and second reinforcement elements each extend along a second direction different from the first direction;
a condenser in fluid communication with the at least one of the evaporators, the condenser spaced from the at least one of the evaporators along the second direction; and
a clamp for compressing the evaporators together along the first direction, the clamp including two end plates and a coupling member extending between the end plates.

32. The heat-transfer system of claim 31, wherein the vapor chamber includes a wick structure coupled to an interior surface of the first wall.

* * * * *